(12) United States Patent
Shaw et al.

(10) Patent No.: US 12,301,230 B2
(45) Date of Patent: May 13, 2025

(54) SWITCH ASSEMBLY WITH FEEDBACK SIGNAL FOR FAULT DETECTION

(71) Applicant: Allison Transmission, Inc., Indianapolis, IN (US)

(72) Inventors: James D. Shaw, Carmel, IN (US); Aaron Ransdell, Brownsburg, IN (US)

(73) Assignee: Allison Transmission, Inc., Indianapolis, IN (US)

( * ) Notice: Subject to any disclaimer, the term of this patent is extended or adjusted under 35 U.S.C. 154(b) by 46 days.

(21) Appl. No.: 18/192,768

(22) Filed: Mar. 30, 2023

(65) Prior Publication Data

US 2023/0361775 A1 Nov. 9, 2023

Related U.S. Application Data

(63) Continuation of application No. 17/445,208, filed on Aug. 17, 2021, now Pat. No. 11,699,998.

(51) Int. Cl.
*H03K 19/003* (2006.01)
*G01R 31/327* (2006.01)
*G06F 3/02* (2006.01)
*H03K 5/24* (2006.01)

(52) U.S. Cl.
CPC ....... *H03K 19/003* (2013.01); *G01R 31/3277* (2013.01); *H03K 5/24* (2013.01); *G06F 3/02* (2013.01)

(58) Field of Classification Search
CPC .... H03K 19/003; H03K 5/24; G01R 31/3277; G06F 3/02
See application file for complete search history.

(56) References Cited

U.S. PATENT DOCUMENTS

| | | | |
|---|---|---|---|
| 6,297,661 B1 | 10/2001 | Chen et al. | |
| 6,606,228 B1 * | 8/2003 | Potter, IV | H01H 47/002 |
| | | | 361/104 |
| 2011/0133743 A1 * | 6/2011 | Barton | F03D 17/00 |
| | | | 324/415 |
| 2013/0229186 A1 * | 9/2013 | Shiraishi | G01R 31/3277 |
| | | | 324/415 |
| 2014/0327450 A1 * | 11/2014 | Schmauss | G01R 31/67 |
| | | | 324/538 |
| 2016/0238658 A1 * | 8/2016 | Edwards | G01R 31/3277 |
| 2019/0049516 A1 | 2/2019 | Jochum et al. | |
| 2019/0101593 A1 | 4/2019 | Grazioli et al. | |
| 2019/0260211 A1 * | 8/2019 | Zhang | H02J 7/0029 |
| 2021/0253258 A1 * | 8/2021 | Kumagai | H01H 1/605 |

* cited by examiner

*Primary Examiner* — Christopher P McAndrew
*Assistant Examiner* — Zannatul Ferdous
(74) *Attorney, Agent, or Firm* — Woodard Emhardt Henry Reeves & Wagner LLP

(57) ABSTRACT

A switch assembly configured to determine when input received from a switch is caused by proper actuation of the switch and should be accepted, or is caused instead by a fault in the switch or in the intervening circuitry and should be ignored and/or reported. The switch assembly optionally includes a logic circuit that is electrically connected to the switch. The logic circuit may provide power to the switch, for example, as a time varying signal, which may then be presented to the logic circuit as input when the switch is properly actuated. The logic circuit may then compare the input from the switch with the signal sent to the switch to determine if a fault is present, or if the switch is operating properly.

18 Claims, 6 Drawing Sheets

SWITCH ASSEMBLY WITH FEEDBACK SIGNAL FOR FAULT DETECTION

CROSS-REFERENCE TO RELATED APPLICATION

This application is a continuation of U.S. patent application Ser. No. 17/445,208 filed Aug. 17, 2021, which is hereby incorporated by reference.

BACKGROUND

The present disclosure generally involves a system for determining when input from a switch can be relied on. In digital electronic circuits, many signals take one of two states: active, or inactive. It is common for a signal to default to the inactive state, and to then be driven to the active state by a signal source. Circuitry receiving the signal often cannot distinguish between a signal that is being intentionally driven to the active state, and a signal that is faulted to the active state. Determining when a switch fault has occurred is generally problematic because in many situations, it is difficult, if not impossible, to determine when a signal received from a switch is the result of proper actuation of the switch, or is the result of a short, ground fault, or other circuit anomaly.

SUMMARY

Disclosed are examples of a switch assembly configured to determine when input received from a switch is caused by proper actuation of the switch and should be considered valid input. On the other hand, the disclosed switch assemblies may also be configured to suppress invalid switch output and optionally to report a malfunction in the switch or fault in the intervening circuits. Using switch assemblies like these, controllers and other such devices may assign a high confidence level to the input received from switches such as, for example, switches on a control panel, buttons on a joystick, or other such user interface configured to accept input from a user by the actuation of switches of different types.

In one example, the switch assembly optionally includes a logic circuit that has a signal input terminal and a signal output terminal. In another aspect, the assembly may include a switch with an input terminal and an output terminal. The input terminal may be electrically connected to the signal output terminal of the logic circuit, the output terminal may be electrically connected to the signal input terminal of the logic circuit, and the switch may be configured to electrically connect the input and output terminals when closed. In another aspect, the logic circuit may be configured to compare input received from the signal input terminal to the output appearing on the signal output terminal. In another aspect, the logic circuit may be configured to generate a fault signal when the input received from the signal input terminal does not match the output on the signal output terminal.

In another aspect, the switch may be an inductive switch, optical switch, or other switching device having an additional ground terminal electrically connected to a circuit ground. In another aspect, the logic circuit may be configured to selectively activate and deactivate the switch by selectively supplying power to the input terminal from the signal output terminal. In another aspect, the logic circuit may be configured to compare the output signal from the output terminal of the switch when the output signal from the output terminal indicates that the switch may be closed.

In another aspect, the output of the signal output terminal may be a time varying signal. In another aspect, the logic circuit may be configured to generate a fault signal when a characteristic of the time varying signal received at the signal input terminal does not match the time varying signal sent on the signal output terminal of the logic circuit. Characteristics of the time varying signal that may be considered include, the frequency, amplitude, duty cycle, phase, or any combination thereof.

In other example switch assembly of the present disclosure, the switch assembly may include an inductive switch, optical switch, or other switching device switch having a power input terminal, a ground terminal, and an output terminal. The switch may be configured to selectively connect the output terminal to the ground terminal in a first position, and the output terminal to the power input terminal in a second position. In another aspect, the switch assembly may include a logic circuit that has an optional signal input terminal and an optional signal output terminal. The signal output terminal may be electrically connected to the power input terminal of the switch, and the signal input terminal may be electrically connected to the output terminal of the switch. The logic circuit may be configured to generate a fault signal when input received on the input terminal does not match output provided on the output terminal.

In another aspect, the switch assembly includes a logic circuit that may be configured to generate a time varying output signal on the signal output terminal and to receive a time varying input signal on the signal input terminal. In another aspect, the switch assembly may include a logic circuit configured to generate the fault signal when the frequency, amplitude, duty cycle, phase, (or any combination thereof) of the input signal and output signal do not match. In another aspect, the logic circuit may be configured to generate a high voltage on the signal output terminal until the logic circuit detects a low voltage on the signal input terminal. In another aspect, the logic circuit may include an internal power switch configured to selectively provide power to the signal output terminal. In another aspect, the logic circuit may be configured to close the internal power switch to provide power to the inductive switch, optical switch, or other powered switching device when no input is received on the signal input terminal. In another aspect, the logic circuit may be configured to open the internal switch to disconnect power to the powered switch device when input is received on the signal input terminal. In another aspect, the logic circuit may be configured to open and close the internal power switch to generate a time varying power signal on the signal output terminal, and wherein the logic circuit may be configured to compare the input received on the signal terminal with the time varying power signal.

Another example of the disclosed concepts includes a switch having an open and a closed position, and a logic circuit electrically connected to the switch. The logic circuit optionally sends a signal to the switch and optionally receives a signal from the switch when the switch is in the closed position. In another aspect, the logic circuit may be configured to report a switch fault when the signal sent to the switch does not match the signal received from the switch. In another aspect, the switch may be an inductive switch. In another aspect, the switch may be a Single-Pole-Single-Throw (SPST) mechanical switch. In another aspect, the switch may be a momentary or "push-on, push-off" switch. In another aspect, the switch may be an optical switch.

In another aspect, the logic circuit may be configured to selectively activate and deactivate the switch by selectively supplying power to the switch. In another aspect, the logic circuit may be configured to compare the output signal from the switch when input is received from the switch. In another aspect, the signal sent to the switch may be a time varying signal, and the logic circuit may be configured to compare the frequency, amplitude, duty cycle, or phase (or any combination thereof) of the signal sent to the switch with the corresponding aspects of the signal received from the switch. In another aspect, the logic circuit may be configured to generate a low voltage signal to the switch until the logic circuit detects a low voltage on the signal received from the switch. In another aspect, an internal power switch may be configured to selectively provide power to activate and deactivate the switch. In another aspect the logic circuit may be configured to open and close the internal power switch to send a time varying signal to the switch.

Further forms, objects, features, aspects, benefits, advantages, and embodiments of the present invention will become apparent from a detailed description and drawings provided herewith.

DETAILED DESCRIPTION

Figure 1:
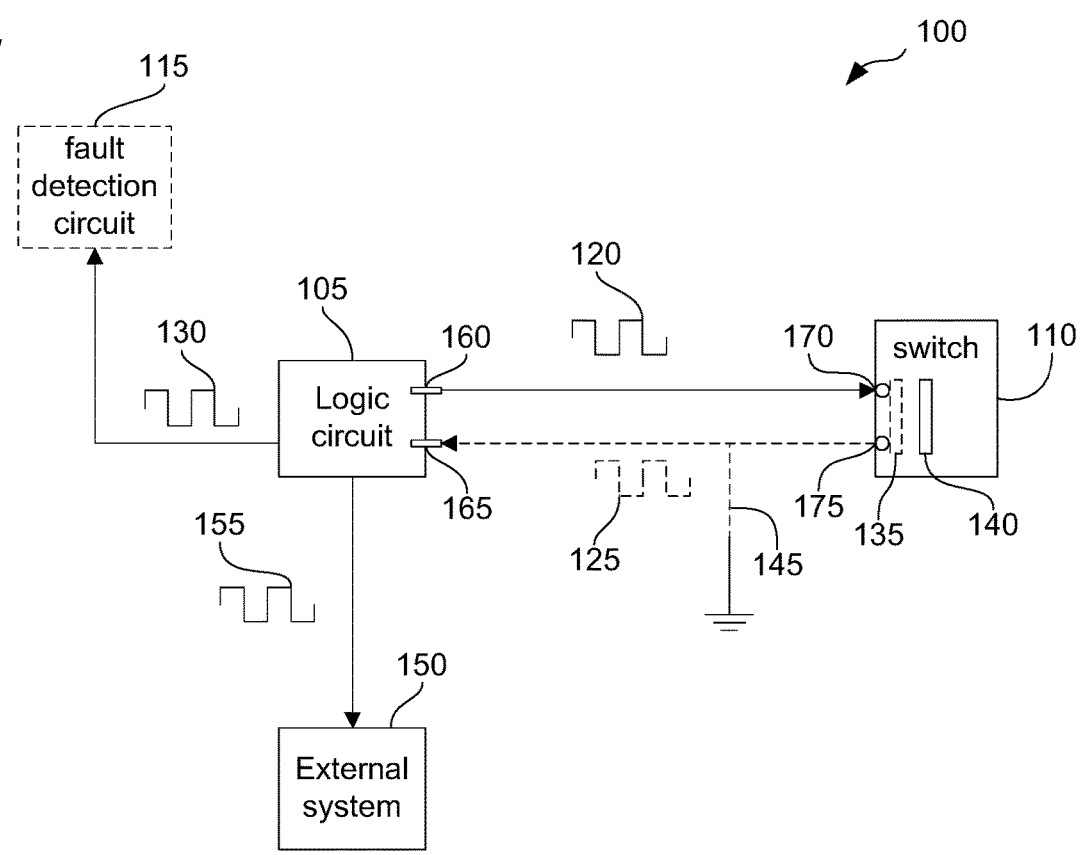
FIG. 1 is a component diagram illustrating one example of a switch assembly according to the present disclosure.

Illustrated at 100 in FIG. 1 is one example of a switch assembly according to the present disclosure. In this example, switch assembly 100 includes a switch 110 that has a closed position 135 and an open position 140 corresponding with the switch being actuated or unactuated respectively. The assembly further includes a logic circuit 105 electrically connected to the switch 110. The logic circuit 105 may optionally include a signal output terminal 160 and a signal input terminal 165 electrically connected to an input terminal 170 and an output terminal 175 respectively of switch 110. In another aspect, the switch 110 may be configured to electrically connect the input terminal 170 and the output terminal 175 when in the closed position 135 (e.g. when the switch is actuated), and to electrically disconnect the input terminal 170 and output terminal 175 when in the open position 140 (e.g. when the switch has not been actuated).

The logic circuit 105 is operable to send an input signal 120 to switch 110, and to optionally receive an output signal 125 from the switch. The logic circuit 105 is arranged and configured to report a switch fault by, for example, sending a fault signal 130 when the input signal 120 sent to the switch does not match the output signal 125 received from the switch. The fault signal 130 may be provided to an optional fault detection circuit 115.

On the other hand, if logic circuit 105 determines that the input signal 120 matches the output signal 125, a control signal 155 may be sent to an external system 150 which may be configured to accept the control signal 155 as input provided by a user. The control signal 155 may thus be interpreted by the external system 150 as input indicating that switch 110 has been pressed. In this way the logic circuit 105 may be configured to generate a fault signal 130 when the input received from signal input terminal 165 does not match the output on signal output terminal 160. In the switch assemblies of the present disclosure, this control signal 155 is sent when the switch is pressed, but it may not be if a fault is present in switch 110 thus advantageously ensuring that the system accepting input from switch 110 is receiving the input the user intended and not an extraneous result due to a malfunction in switch 110.

The logic circuit 105 is configured to compare input received from the signal input terminal 165 to the output on the signal output terminal signal output terminal 160, for example, to determine if a fault 145 is present. The fault 145 is shown here as a ground fault which may be caused by moisture or other foreign debris causing intermittent contact between input terminal 170 and output terminal 175.

In another aspect, the logic circuit may be configured to compare the output signal 125 received from the output terminal of the switch 110 when the output signal 125 from the output terminal indicates that the switch 110 is in the closed position 135. For example, the logic circuit may be configured to monitor the output signal 125 when the logic circuit 105 detects what it believes is a switch actuation at switch 110 (e.g. a button press, or slider moved). The logic circuit 105 may then generate an input signal 120 which may be, for example, a time varying digital or analog signal. The logic circuit 105 may optionally generate fault signal 130 when an aspect of the time varying signal 125 received at the signal input terminal 165 does not match the corresponding aspect of the time varying signal 120 sent on the signal output terminal 160 of the logic circuit. Such aspects of the time varying signal may include the frequency, duty cycle, amplitude, or phase of the signal, or any one or more of these in any suitable combination thereof.

Figure 2:
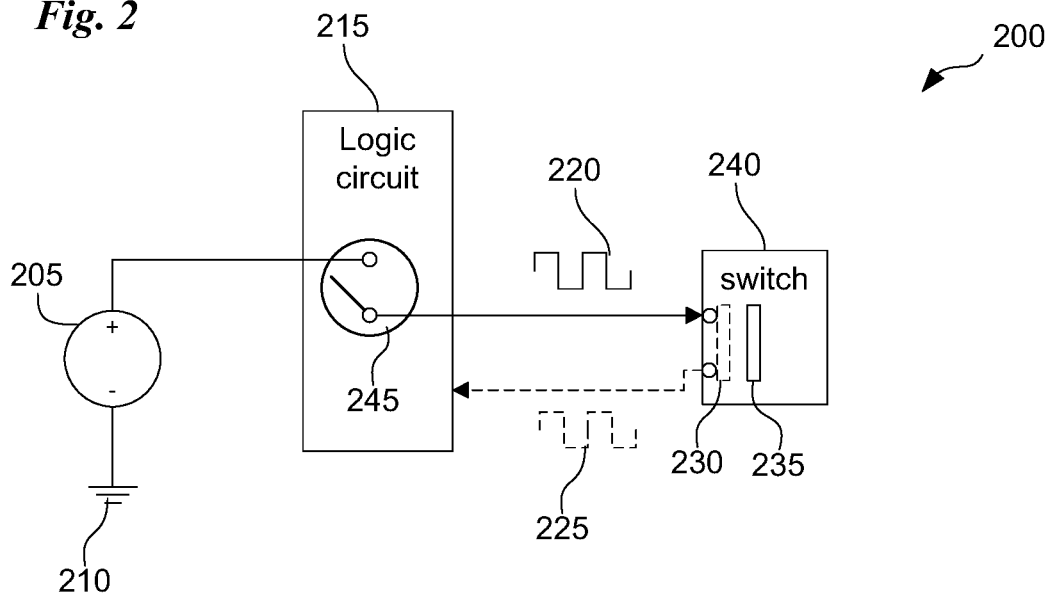
FIG. 2 is a component diagram illustrating additional aspects of a switch assembly like the one in FIG. 1.

Other aspects of the disclosed switch assemblies are illustrated in another example shown in FIG. 2 at 200. The switch assembly 200 includes a switch 240 that has a closed position 230 and an open position 235 position. The assembly also includes a logic circuit 215 electrically connected to the switch 240 and operable to send an input signal 220 to switch 240, and to optionally receive an output signal 225 in response. The logic circuit 215 may include an internal switch 245 configured to selectively activate and deactivate the switch 240 by selectively supplying power to the switch 240 according to logic in the logic circuit 215. In this way, logic circuit 215 can determine when the output signal 225 received from switch 240 is valid or not valid by regulating power to the switch rather than having the switch always connected to power (or ground).

Figure 3:
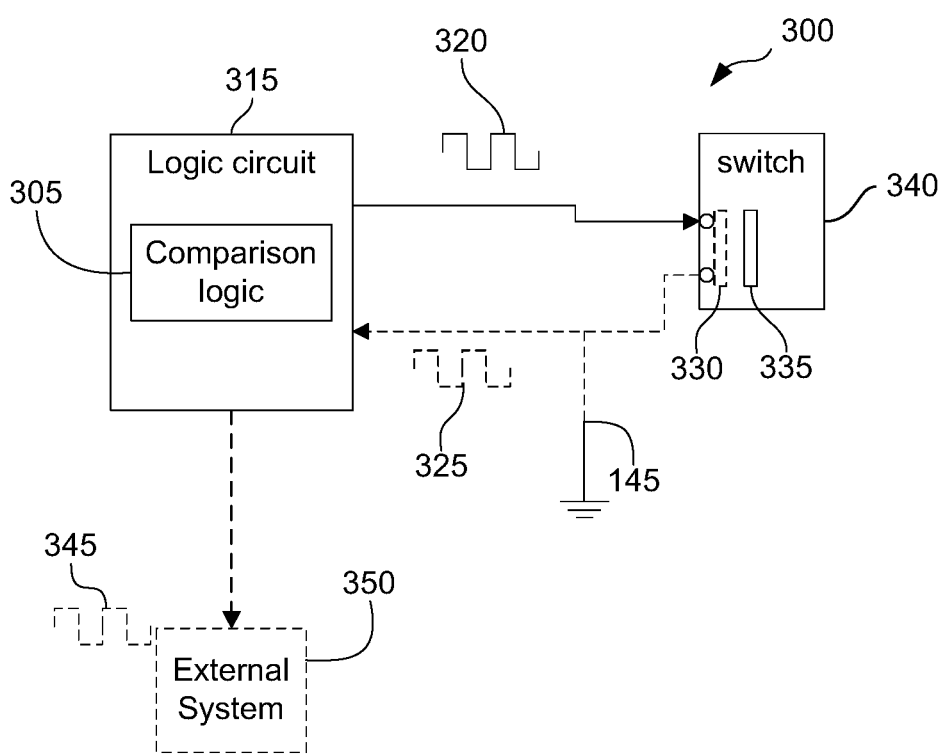
FIG. 3 is a component diagram illustrating additional aspects of a switch assembly like the one in FIGS. 1 and 2.

In another example shown in FIG. 3 at 300, a switch assembly of the present disclosure includes a logic circuit 315 configured to send an input signal 320 to a switch 340, and to receive an output signal 325 from the switch 340 when the switch is closed. The switch 340 has a closed position 330 and an open position 335, and when operating properly, the output signal 325 is sent back to the logic circuit 315 when switch 340 is in the closed position, and no output signal 325 is sent when switch 340 is in the open position.

The logic circuit 315 may include comparison logic 305 configured to compare aspects of the output signal 325 when input is received from the switch 340. In another aspect, the comparison logic 305 is optionally configured to compare the frequency, amplitude, phase, or other aspect of the input signal 320 sent to the switch with the corresponding aspect of the output signal 325 received from the switch. When the signals sent match the signals received, the logic circuit 315 may be configured to send a control signal 345 to an optional external system 350. In one example, the input signal 320 sent to the switch is optionally a time varying signal, such as a square wave, sine wave, or any other suitable wave form, an example of which is shown in FIGS. 4 and 5.

Figure 4:
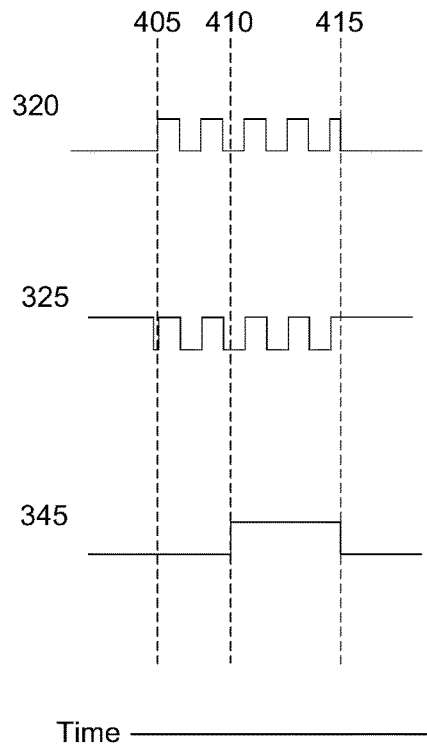
FIG. 4 is a timing diagram illustrating timing aspects of the disclosed switch assemblies.
Figure 5:
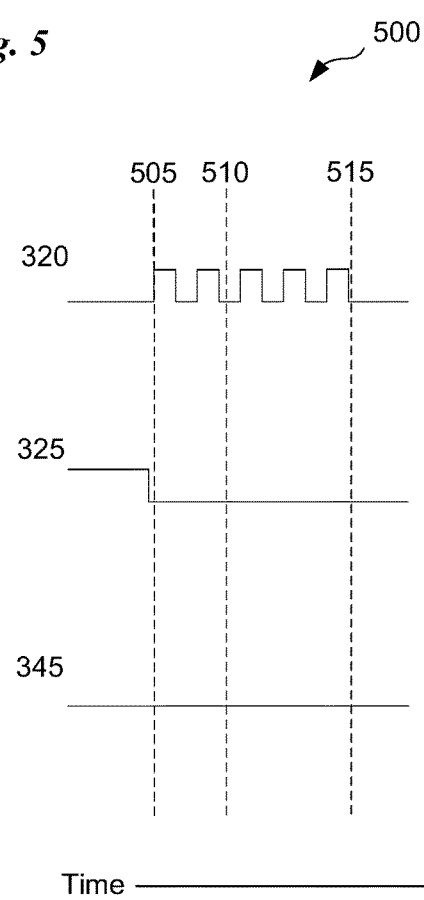
FIG. 5 is a timing diagram illustrating additional timing aspects of the disclosed switch assemblies.

As shown in FIG. 4, the input signal 320 is shown at 400 where the logic circuit 315 is optionally arranged and configured to generate a low voltage signal to switch 340 until the logic circuit detects a low voltage on the output signal 325 received from the switch, such as at 405. In this example, the logic circuit 315 may internally be configured with a switching device that holds the input signal 320 low by electrically connecting the output to ground, and the output signal 325 in a high voltage state.

This state may continue indefinitely until switch 340 is actuated to a closed position 330 at 405 causing the output signal 325 to optionally be dropped to a low voltage state. At this moment (405), logic circuit 315 cannot be certain whether the low voltage output signal 325 is now caused by a proper actuation of switch 340, or is instead being generated because of a malfunction in the switch or a fault in the circuitry. The logic circuit 315 may here begin generating input signal 320 at 405 in response to signal 325, passing the input signal 320 through the switch 340. The logic circuit may then accept the output signal 325 as input to the comparison logic 305 which may then compare aspects of the input signal 320 sent and the output signal 325 received to determine if they match.

The logic circuit 315 may determine after a short period of time at 410 that the input received from switch 340 was caused by an actuation of the switch, and not by a fault in the switch or the circuitry. This determination is made after comparing the frequency, duty cycle, amplitude, or other aspects of the signals sent on input signal 320 and the corresponding aspects of the signal arriving on output signal 325. The signal is shown in FIG. 4 as a digital square wave, but any signal may be used such as a sine wave, or more complex composite wave form such as may be generated by the combination of multiple wave forms. The logic circuit 315 may then send a "positive" status signal to a fault detection circuit if one is present. The logic circuit 315 may also then provide a control signal 345 to the system that switch 340 is configured to accept input for. At 415, the logic circuit 315 determines that the input has ceased (e.g. switch is no longer actuated, or has been returned to its original position) by using the same analytical approach to input signal 320 and output signal 325. The output signal 325 may return to its (optional) default "high" state, and input signal 320 to its (optional) default "low" state and the control signal 345 is no longer sent.

In another example shown at FIG. 5, the logic circuit 315 detects a low signal on output signal 325 at 505, and in this case, the signal is caused by a fault condition in the switch 340, or in the switch circuitry. The logic circuit 315 compares the input signal 320 and the output signal 325 beginning at 505, and determines at 510 that the input and output signals do not match, thus resulting in logic circuit 315 generating a fault signal if needed, and not generating a positive control signal 345 to the external system 350. At some later time 515, the logic circuit may cease sending input signal 320 to conserve power, or in response to a "reset" initiated by logic circuit 315. In these scenarios of FIGS. 4 and 5, the disclosed switch assemblies advantageously send correct input to the external system 350 and avoid sending erroneous input thus providing a high level of confidence that the input was in fact initiated by a user.

Figure 6:
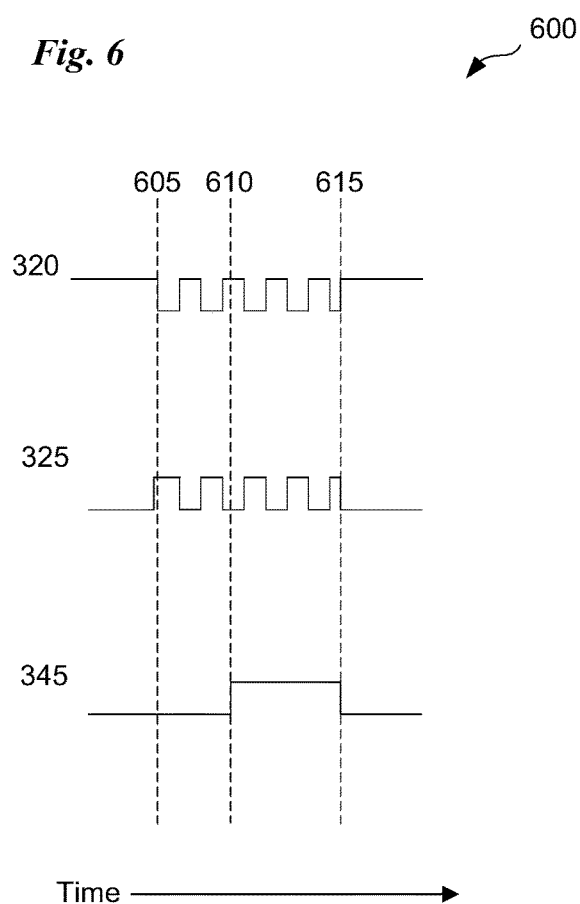
FIG. 6 is a timing diagram illustrating additional timing aspects of the disclosed switch assemblies.

FIG. 6 illustrate other combinations of signals 320, 325, and 345 at 600 which may result from the disclosed switch assembly. Any suitable combination of signals may be used. As illustrated at 600, the disclosed logic circuits (such as circuit 315) may be optionally arranged and configured to generate a signal 320 to the switch until the logic circuit detects a corresponding signal on the output signal 325 received from the switch. This condition is shown at time 605. In the example of FIG. 6, the disclosed logic circuits may be internally configured with a switch that holds the input signal 320 high by electrically connecting the output to power, and the output signal 325 may be configured to remain at a low voltage or grounded state unless the switch is actuated.

This state may continue indefinitely until the switch is actuated to a closed position at 605 causing the output signal 325 to optionally rise to a high voltage state. At this moment (605), logic circuit 315 cannot be certain whether the output signal 325 is now caused by a proper actuation of switch 340, or is instead being caused by a malfunction in the switch or a fault in the circuitry. The logic circuit 315 begins generating input signal 320 at 605 in response to signal 325, passing the input signal 320 through the switch 340. In this example, the switch circuitry is configured to accept the input signal 320 and reverse the incoming wave form. The logic circuit may then accept the output signal 325 as input to the comparison logic 305 which may then compare aspects of the input signal 320 provided to the switch, and the output signal 325 received from the switch. In this example, a "matching" or "expected" waveform means that 325 is the inverse of 320.

At 610, the logic circuit 315 determines that the input received from switch 340 was in fact caused by an actuation of the switch, and not by a fault in the switch or the circuitry. As disclosed in other examples, this determination may be made by comparing the frequency, duty cycle, amplitude, or other aspects of the signals sent on input signal 320 and those arriving on output signal 325. The illustrated signals are digital square waves, but any signal may be used such as a sine wave, or more complex composite wave form. The logic circuit 315 may then send a "positive" status signal to a fault detection circuit, and a control signal 345 may be sent as input to the external system 350 this switch is electrically connected to. At 615, the logic circuit 315 may determine that the input has ceased (e.g. switch is no longer actuated, or has been returned to its original position) by using the same analytical approach to input signal 320 and output signal 325. The output signal 325 returns to its (optional) default "low" state, and input signal 320 returns to its (optional) default "high" state and the logic circuit ceases sending control signal 345.

Figure 7:
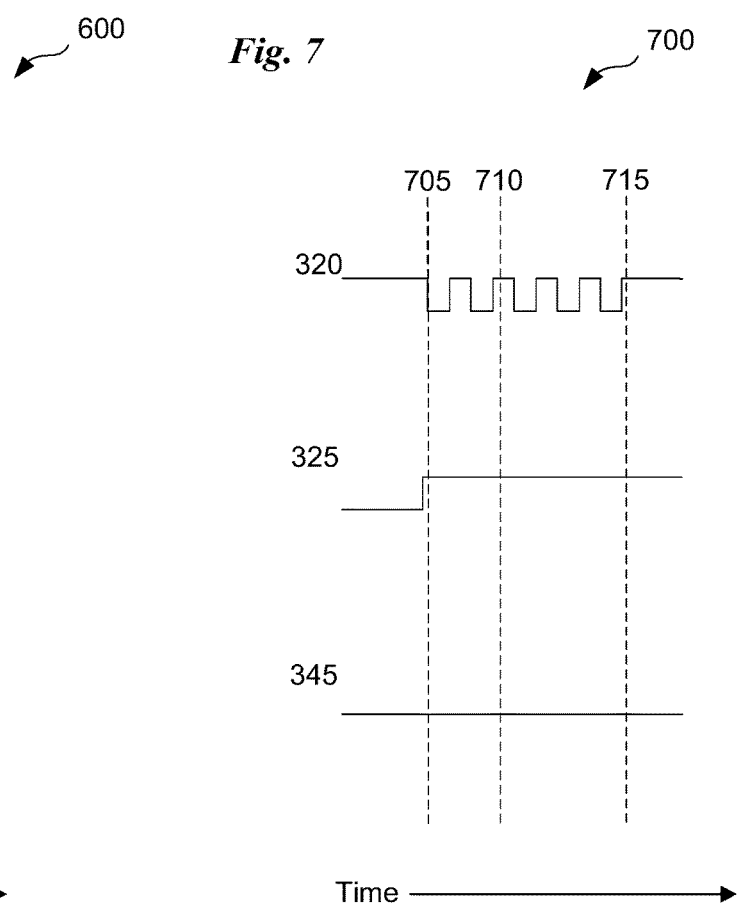
FIG. 7 is a timing diagram illustrating additional timing aspects of the disclosed switch assemblies.

In another related example shown at FIG. 7, the logic circuit 315 detects a high signal on output signal 325 at 705, and in this case, the signal is caused by a fault condition in the switch 340, or in the switch circuitry. The logic circuit 315 compares the input signal 320 and the output signal 325 beginning at 705, and determines at 710 that the output signal is not what was expected (e.g. is not the inverse of the input signal), thus resulting in logic circuit 315 generating a fault signal if needed, and not generating a positive control signal 345 to the external system 350.

Figure 8:
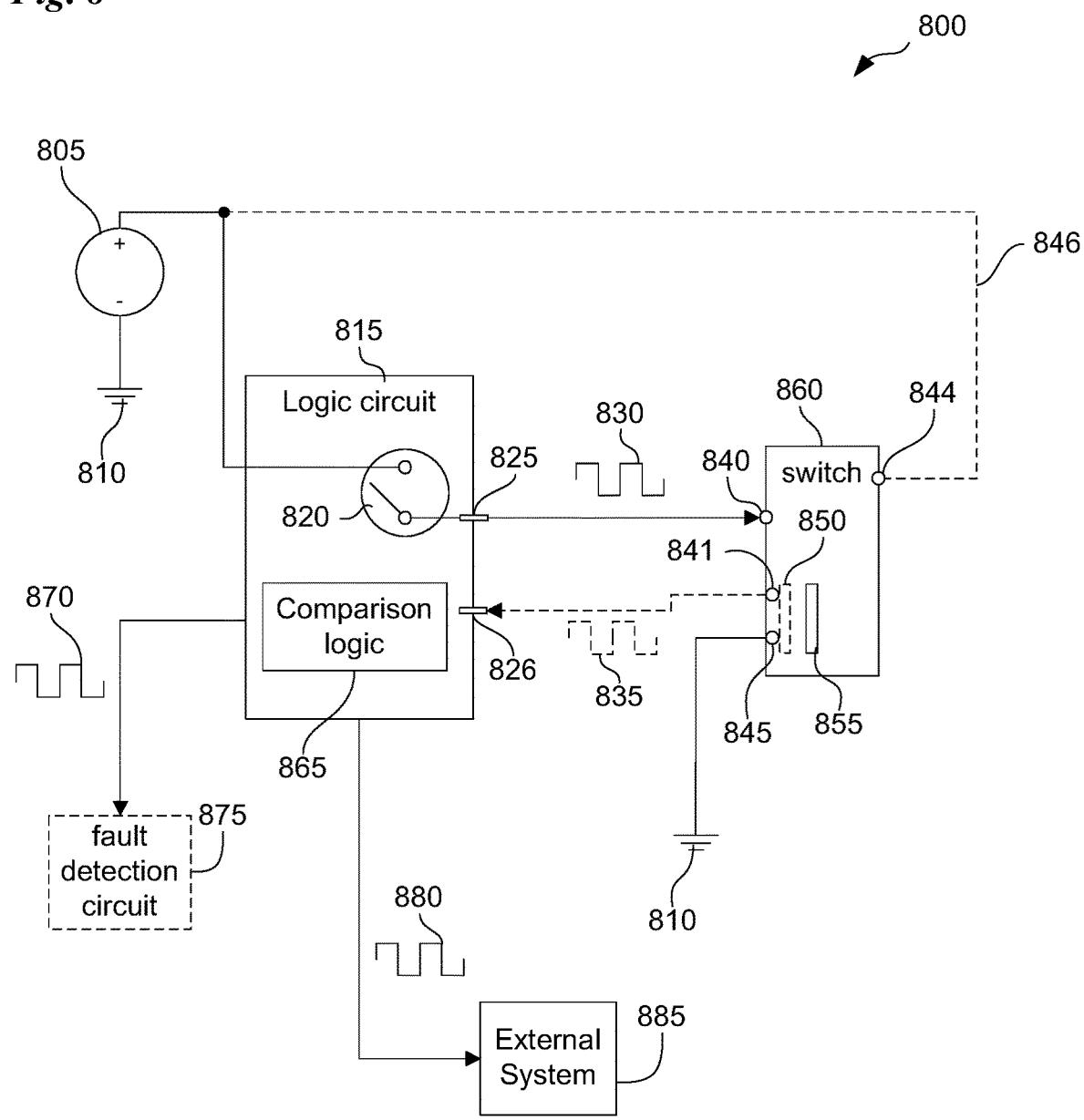
FIG. 8 is a component diagram illustrating another example of a switch assembly according to the present disclosure.

Illustrated at 800 in FIG. 8 is another example of a switch assembly according to the present disclosure. The switch assembly 800 as illustrated includes any suitable type of switch 860 having a power input terminal 840 such as an inductive switch, optical switch, or other powered switching device. The power input terminal 840 may also be useful for accepting an output signal 830. The switch 860 optionally includes an output terminal 841 that is configured to be actuatable from an open position 855 to a closed position 850. In this aspect, the switch 860 may be configured to selectively electrically connect the output terminal 841 to the ground terminal 845 in the closed position 855. In this configuration, the ground terminal 845 may be electrically connected to a ground 810. In another aspect, the switch 860 may optionally use or require a separate power connection 846 electrically connected to power supply 805 and a separate switch power terminal 844. This separate power supply received at terminal 844 may be useful for actuating switch 860, or for providing power to logic or other activation circuitry which may be present in switch 860.

The switch assembly 800 optionally includes a logic circuit 815 that has a signal output terminal 825 and a signal input terminal 826. In this example, the signal output terminal 825 is electrically connected to the power input terminal 840 of the switch 860, and the signal input terminal 826 is electrically connected to the output terminal 841 of the switch 860. The logic circuit 815 is optionally configured to generate a fault signal 870 when input signal 835 received on the signal input terminal 826 is not what was expected based on the output signal 830 provided on the signal output terminal 825. In this way, logic circuit 815 may determine that a fault condition is occurring with switch 860.

In another aspect, the logic circuit 815 is optionally configured to generate a time varying output signal 830 on the signal output terminal 825 and to receive a time varying input signal 835 on the signal input terminal 826. This time varying signal may be of any suitable frequency such as greater than 1 Hz (1 cycle per second), greater than 1,000 Hz, greater than 1,000,000 Hz, and the like. The logic circuit 815 may compare aspects of the output signal 830 and input signal 835 to determine what sort of fault signal 870 to generate. For example, fault signal 870 may be a fault signal, or a "negative status signal" when aspects of the output signal 830 do not match corresponding aspects of the input signal 835. In another example, fault signal 870 may be a positive status signal when the frequency, amplitude, phase, or duty cycle, or any combination thereof, of the output signal 830 or input signal 835 do match. In yet another example, fault signal 870 may only be sent when a fault is detected, and may not be sent otherwise.

In another aspect, the logic circuit 815 may be configured to generate a low voltage on the signal output terminal 825 until the logic circuit 815 detects a low voltage on the signal input terminal 826. In another aspect, the 815 may include an internal switch 820 configured to selectively provide power from power supply 805 to the signal output terminal. This power may be provided continuously, or as a time varying output signal 830. The logic circuit 815 may automatically open and close internal switch 820 to provide a digital signal with a predetermined frequency, duty cycle, or phase. In another example, the logic circuit 815 may be configured to automatically adjust the voltage output on signal output terminal 825 from a low value to a high value in predetermined increments, or as continuously variable analog output signal 830.

In another aspect, the logic circuit may be configured to close the internal switch 820 to provide power to the powered switch 860 when no input is received on the signal input terminal. In another aspect, the internal switch 820 may be configured to automatically open to thus disconnect power to the powered switch 860 when input is received on the signal input terminal 826. In yet another aspect, the logic circuit 815 may be configured to open and close the internal switch 820 to generate a time varying power signal on the signal output terminal 825, and logic circuit 815 may be configured to automatically compare the input received on the signal input terminal 826 with the time varying output signal 830 to determine if a fault condition has occurred. In this way, logic circuit 815 may use the signal 830 to activate and deactivate switch 860 so that if switch 860 is operating properly, the input signal 835 on terminal 826 will closely match the output signal 830.

If a fault condition does occur, a "negative" fault signal 870 may be sent to the fault detection circuit 875 and no output signal control signal 880 sent to external system 885. The fault detection circuit 875 may be included as part of a controller or other device configured to accept diagnostic input from switch assembly 800, and this fault condition indicator may be used to notify maintenance personnel that switch assembly 800 has failed. Where no fault condition occurs, fault signal 870 may send a status indicator notifying fault detection circuit 875 that switch assembly 800 is operational, and may provide control signal 880 to external system 885 when switch 860 is actuated.

Figure 9:
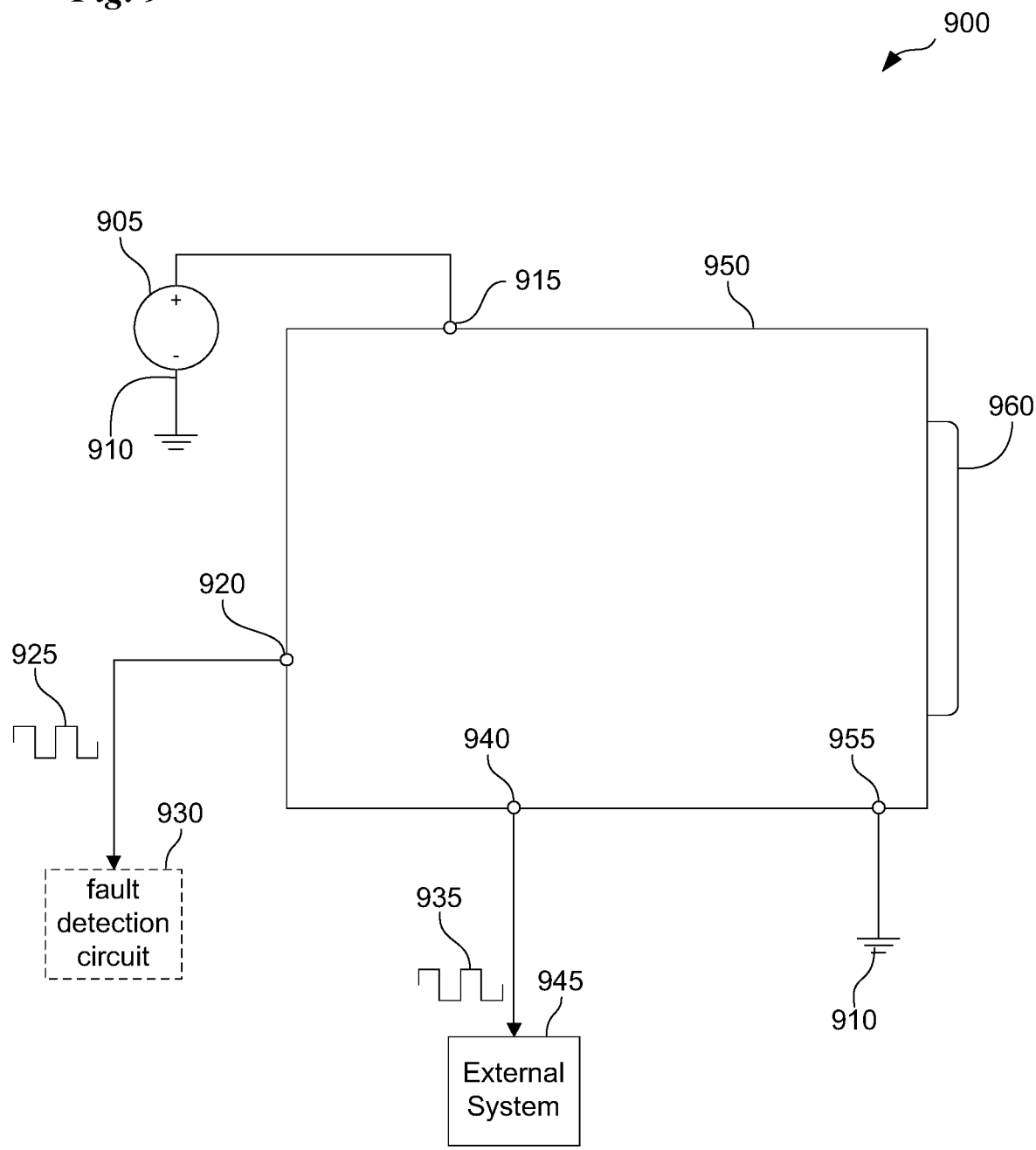
FIG. 9 is a component diagram illustrating another example of a switch assembly according to the present disclosure.

Illustrated at 900 in FIG. 9 is another example of a switch assembly of the present disclosure. The switch assembly 900 includes a housing 950 that may be configured to include any of the examples of a switch assembly disclosed herein. The switch assembly 900 may optionally include a separate power input terminal 915 (like the optional input terminal 844 of FIG. 8) that is electrically connected to and accepting power input from, a power supply 905. The power supply 905 may also be electrically connected to ground 910 as shown.

The switch assembly 900 may also include a status terminal 920 electrically connecting the switch assembly to a fault detection circuit 930. A status signal 925 may be sent to fault detection circuit 930 using status terminal 920. A control output terminal 940 may be electrically connected to an external system 945 thus providing a control signal 935 to an external system that may rely on switch assembly 900 to provide user input. The switch assembly 900 may also include an optional ground terminal 955 electrically connected to ground 910.

In this example of a switch assembly, the logic circuits, internal switches, comparison logic, and any other relevant portions of the switch assembly may be included in, and/or mounted to, the housing 950 so that the switch assembly 900 may be installed as a single "package" or unit. For example, multiple examples of switch assembly 900 may be installed in an instrument panel for a vehicle, in a control panel for manufacturing equipment, in a joystick for operating heaving equipment, and the like.

Other examples of the disclosed concepts include the following numbered examples:

Example 1

A switch assembly, comprising:
a switch, having an open and a closed position; and a logic circuit electrically connected to the switch, wherein the logic circuit sends a signal to the switch and receives a signal from the switch when the switch may be in the closed position, and wherein the logic circuit may be configured to report a switch fault when the signal sent to the switch does not match the signal received from the switch.

Example 2

The switch assembly of example 1, wherein the switch may be an inductive switch or an optical switch, or any combination thereof.

Example 3

The switch assembly of any preceding example, wherein the logic circuit may be configured to selectively activate and deactivate the switch by selectively supplying power to the switch.

Example 4

The switch assembly of any preceding example, wherein the logic circuit may be configured to compare the output signal from the switch when input may be received from the switch.

Example 5

The switch assembly of any preceding example, wherein the signal sent to the switch may be a time varying signal, and wherein the logic circuit compares the frequency, amplitude, duty cycle, and/or phase of the signal sent to the switch with the corresponding frequency, amplitude, duty cycle, and/or phase of the signal received from the switch.

Example 6

The switch assembly of any preceding example, wherein the logic circuit may be configured to generate a low voltage signal to the switch until the logic circuit detects a low voltage on the signal received from the switch.

Example 7

The switch assembly of any preceding example, wherein the logic circuit comprises: an internal power switch configured to selectively provide power to activate and deactivate the switch.

Example 8

The switch assembly of any preceding example, wherein the logic circuit may be configured to open and close the internal power switch to send a time varying signal to the switch.

Example 9

A switch assembly, comprising:
a logic circuit that has a signal input terminal and a signal output terminal; and a switch with an input terminal and an output terminal, wherein the input terminal may be electrically connected to the signal output terminal of the logic circuit, wherein the output terminal may be electrically connected to the signal input terminal of the logic circuit, and wherein the switch may be configured to electrically connect the input and output terminals when closed;
wherein the logic circuit may be configured to compare input received from the signal input terminal to the output on the signal output terminal.

Example 10

The switch assembly of any preceding example, wherein the logic circuit may be configured to generate a fault signal when the input received from the signal input terminal does not match the output on the signal output terminal.

Example 11

The switch assembly of any preceding example, wherein the switch may be an inductive switch having an additional ground terminal electrically connected to a circuit ground.

Example 12

The switch assembly of any preceding example, wherein the logic circuit may be configured to selectively activate and deactivate the switch by selectively supplying power to the input terminal from the signal output terminal.

Example 13

The switch assembly of any preceding example, wherein the logic circuit may be configured to compare the output signal from the output terminal of the switch when the output signal from the output terminal indicates that the switch may be closed.

Example 14

The switch assembly of any preceding example, wherein the output of the signal output terminal may be a time varying signal.

Example 15

The switch assembly of any preceding example, wherein the logic circuit may be configured to generate a fault signal when a frequency of the time varying signal received at the signal input terminal does not match the frequency of the time varying signal sent on the signal output terminal of the logic circuit.

Example 16

A switch assembly, comprising:
an inductive or an optical switch having a power input terminal, a ground terminal, and an output terminal, wherein the inductive switch may be configured to selectively connect the output terminal to the ground terminal in a first position; and
a logic circuit that has a signal input terminal and a signal output terminal, wherein the signal output terminal may be electrically connected to the power input terminal of the switch, and wherein the signal input terminal may be electrically connected to the output terminal of the switch;

wherein the logic circuit generates a fault signal when input received on the input terminal does not match output provided on the output terminal.

Example 17

The switch assembly of any preceding example, wherein the logic circuit may be configured to generate a time varying output signal on the signal output terminal and to receive a time varying input signal on the signal input terminal.

Example 18

The switch assembly of any preceding example, wherein the logic circuit generates the fault signal when the frequency, amplitude, duty cycle, and/or phase of the input signal and output signal do not match.

Example 19

The switch assembly of any preceding example, wherein the logic circuit may be configured to generate a high voltage on the signal output terminal until the logic circuit detects a low voltage on the signal input terminal.

Example 20

The switch assembly of any preceding example, wherein the logic circuit comprises: an internal power switch configured to selectively provide power to the signal output terminal.

Example 21

The switch assembly of any preceding example, wherein the logic circuit may be configured to close the internal power switch to provide power to the switch when no input may be received on the signal input terminal.

Example 22

The switch assembly of any preceding example, wherein the logic circuit may be configured to open the internal switch to disconnect power to the switch when input may be received on the signal input terminal.

Example 23

The switch assembly of any preceding example, wherein the logic circuit may be configured to open and close the internal power switch to generate a time varying power signal on the signal output terminal, and wherein the logic circuit may be configured to compare the input received on the signal terminal with the time varying power signal.

Glossary of Definitions and Alternatives

While examples of the inventions are illustrated in the drawings and described herein, this disclosure is to be considered as illustrative and not restrictive in character. The present disclosure is exemplary in nature and all changes, equivalents, and modifications that come within the spirit of the invention are included. The detailed description is included herein to discuss aspects of the examples illustrated in the drawings for the purpose of promoting an understanding of the principles of the inventions. No limitation of the scope of the inventions is thereby intended. Any alterations and further modifications in the described examples, and any further applications of the principles described herein are contemplated as would normally occur to one skilled in the art to which the inventions relate. Some examples are disclosed in detail, however some features that may not be relevant may have been left out for the sake of clarity.

Where there are references to publications, patents, and patent applications cited herein, they are understood to be incorporated by reference as if each individual publication, patent, or patent application were specifically and individually indicated to be incorporated by reference and set forth in its entirety herein.

Singular forms "a", "an", "the", and the like include plural referents unless expressly discussed otherwise. As an illustration, references to "a device" or "the device" include one or more of such devices and equivalents thereof.

Directional terms, such as "up", "down", "top" "bottom", "fore", "aft", "lateral", "longitudinal", "radial", "circumferential", etc., are used herein solely for the convenience of the reader in order to aid in the reader's understanding of the illustrated examples. The use of these directional terms does not in any manner limit the described, illustrated, and/or claimed features to a specific direction and/or orientation.

Multiple related items illustrated in the drawings with the same part number which are differentiated by a letter for separate individual instances, may be referred to generally by a distinguishable portion of the full name, and/or by the number alone. For example, if multiple "laterally extending elements" 90A, 90B, 90C, and 90D are illustrated in the drawings, the disclosure may refer to these as "laterally extending elements 90A-90D," or as "laterally extending elements 90," or by a distinguishable portion of the full name such as "elements 90".

The language used in the disclosure are presumed to have only their plain and ordinary meaning, except as explicitly defined below. The words used in the definitions included herein are to only have their plain and ordinary meaning. Such plain and ordinary meaning is inclusive of all consistent dictionary definitions from the most recently published Webster's and Random House dictionaries. As used herein, the following definitions apply to the following terms or to common variations thereof (e.g., singular/plural forms, past/present tenses, etc.):

"About" with reference to numerical values generally refers to plus or minus 10% of the stated value. For example, if the stated value is 4.375, then use of the term "about 4.375" generally means a range between 3.9375 and 4.8125.

"Actuate" generally refers to acting on an object with an outside force, to cause someone or something to act in a particular way, or to cause a machine or device to operate, to act in a new way, or to cease operating altogether.

"Actuator" generally refers to a device that is operable to act on another device, usually to control its operation, or some aspect thereof. An actuator may be one of and/or a combination of many types. For example, an actuator may be mechanical, electrical, pneumatic, and/or hydraulic.

"Contact" generally refers to a portion of an electric circuit arranged and configured to pass an electrical current when touching another electrically conductive portion of the circuit. For example, contacts may be used in relays, switches, connectors, and/or circuit breakers to physically complete an electric circuit. Contacts are said to be closed when they are touching and are said to be open when they are separated. When closed, contacts allow the flow of electrical current. When open, contacts are separated by a gap that includes an insulative material or gas thus obstructing the flow of current. Contacts are typically metallic, such as copper or gold, to allow current flow. However, contacts may also be made of a semi-conductive material such as silicon or germanium. Additionally, contacts may be made of a nonmetallic conductive material such as graphite.

"Control Logic" generally refers to hardware or software configured to implement an automatic decision making process by which inputs are considered, and corresponding outputs are generated. The output may be used for any suitable purpose such as to provide specific commands to machines or processes specifying specific actions to take. Examples of control logic include computer programs executed by a processor to accept commands from a user and generate output according to the logic implemented in the program as executed by the processor. In another example, control logic may be implemented as a series of logic gates, microcontrollers, and the like, electrically connected together in a predetermined arrangement so as to accept input from other circuits or computers and produce an output according to the rules implemented in the logic circuits.

"Controller" generally refers to a mechanical or electronic device configured to control the behavior of another mechanical or electronic device. A controller may include a "control circuit" configured to provide signals or other electrical impulses that may be received and interpreted by the controlled device to indicate how it should behave.

"Duty Cycle" or "power cycle" generally refers to the fraction of one period of a wave in which a signal or system is active. In this case, a period is the time it takes for a signal to complete an on-and-off cycle. The duty cycle may thus be thought of as the percentage of each period where the waveform is above the zero axis. Duty cycle may also be thought of as the ratio of "active" to "inactive" states during one period of the wave.

"Electrically Connected" generally refers to a configuration of two objects that allows electricity to flow between them or through them. In one example, two conductive materials are physically adjacent one another and are sufficiently close together so that electricity can pass between them. In another example, two conductive materials are in physical contact allowing electricity to flow between them.

"Fault Detection Circuit" generally refers to a circuit configured to detect fault conditions which are unusual conditions in components connected to a circuit thus providing the ability for the circuit to determine the source of the unusual condition. For example, an outage detection circuit may be configured to detect faults in a switch or contactor such as by receiving input indicating that the switch should be closed and is not, or should be open and is not. In another example, a fault detection circuit may receive input indicating that an electronic component such as a logic circuit, LED indicator, sensor, emitter, and the like has failed.

"Ground" or "circuit ground" generally refers to a node in an electrical circuit that is designated as a reference node for other nodes in a circuit. It is a reference point in an electrical circuit from which voltages are measured, a common return path for electric current, and/or a direct physical connection to the Earth.

"Inductive Switch" or "Inductive Proximity Switch" generally refers to a switching device that includes a non-contact electronic proximity sensor configured to use electromagnetic induction and the proximity of a nearby object to open or close a circuit. An inductive switch may include, or be responsive to, a sensor that includes an induction loop or detector coil. The detector coil may include multiple turns of insulated magnet wire wound around a high magnetic permeability core, such as a ferrite ceramic rod or coil form, and the winding may or may not have a feedback tap some number of turns from one end of the total winding. It may also be connected to a capacitance to form a tuned frequency oscillator tank circuit. In another aspect, a voltage or current gain device like a transistor or operational amplifier may also be included to form a tuned frequency oscillator.

When power is applied to the switch, the resulting oscillation will include a high frequency alternating electric current in the coil that has a constantly changing magnetic field able to induces eddy currents in nearby target conductors. The closer the target is and the greater its conductivity, the greater the induced eddy currents are and the more effect their resulting opposing magnetic fields have on the magnitude and frequency of the oscillation. This effect can be used to detect metallic objects that interact with a magnetic field. Non-metallic substances such as liquids or some kinds of dirt do not interact with the magnetic field, making an inductive sensor a good choice in adverse conditions where water or dirt are present and are likely to cause other kinds of switches to malfunction.

"Logic Circuit" generally refers to a circuit that takes input from one or more sources and provides output based on logical rules and/or inferences implemented in the circuit. These logical rules may be implemented using any suitable logic circuit such as by different arrangements of logic gates (e.g. AND, OR, NOT, XOR, etc.), rules implemented in software and executed by a processor or microcontroller, and the like.

"Multiple" is generally synonymous with the term "plurality" and refers to more than one, or by extension, two or more.

"Optionally" means discretionary; not required; possible, but not compulsory; left to personal choice.

"Optical Switch", "Photointerrupter", "Optocoupler", or "optoisolator" generally refers to an electronic component with a light emitter such as an LED that operates in conjunction with a photo-sensitive sensor, such as a photodiode or phototransistor. The emitter and sensor may be mounted together in the same package, or may be in separate packages. The optical switch is operable to detect an object comes between the emitter and sensor elements when the object blocks the emitted light from reaching the sensor. The optical switch may be configured have multiple states such as an "on" state where the switch is configured to provide voltage or current at one level when the object is present, and another different "off" state where the voltage or current output is increased or decreased when the object is absent. An optical switch may be thought of as an example of a "powered switch" as power is required to maintain the emitted light and to provide the voltage or current output when the switch changes state.

"Power Supply" generally refers to an electrical device that provides electrical power to an electrical load, such as electrical machines and/or electronics.

"Signal" generally refers to a detectable physical quantity or impulse (such as a voltage, current, or magnetic field strength) by which messages or information can be transmitted. This includes any time varying voltage, current or electromagnetic wave that carries information.

The concept also includes any observable change in a monitored entity, such as in the case of watching for signal in the form of a raised flag or a launched flare, or continuously evaluating a location in a computer memory and reacting differently depending on the values stored there over time, or monitoring radio waves on a predetermined frequency for a predetermined pattern of analog or digital variations. Any physical quantity that exhibits variation in space or time can be a signal used, among other possibilities, to share messages between observers, transmitters, or receivers. Examples include audio, video, speech, image, sonar and radar-related time varying aspects.

A signal may or may not contain any intrinsic information, such as in the case where random variations (i.e. "noise") may be observed but may itself be accepted as a transmission of information. For example, not receiving an expected series of variations (i.e. an intended signal), and receiving instead only random noise may be taken to mean that the expected transmitter is malfunctioning, or is otherwise offline.

"Switch" or "Switching Device" generally refers to an electrical component that can break an electrical circuit. A switch may interrupt the current in the circuit, and/or divert the flow of current from one conductor electrically coupled to one circuit, to another separate conductor electrically coupled to a separate circuit. The mechanism of a switch may be operated directly by a human operator (e.g. turning on a light switch, pressing a keyboard button, or by moving a hand to break a beam of light), may be operated by one object moving adjacent to or relative to another object such as a door-operated switch, or may be operated by a sensor detecting changes in a sensed parameter such as pressure, temperature, magnetic or electrical field strength, and the like.

A switch may divert current from on conductor to another by any suitable means such as by physically moving a switching element contacting one conductor electrically coupled to a first circuit, to directly contact a different conductor electrically coupled to a second circuit. This may occur by physical mechanical means (e.g. one or more metal contacts moving inside a switch, relay, or contactor), or by changing the electrical properties of a material such as a semiconducting material to temporarily break and/or divert a flow of current. For example, a transistor may operate as a switch diverting the flow of electricity when a voltage or current applied to one pair of the transistor's terminals changes the current through another pair of terminals.

"Switch Assembly" generally refers to a collection of components operating together to function as a switch. These components may be grouped together in a common housing, or may be positioned apart from one another in separate locations.

"Terminal" means a plug, socket or other connection (male, female, mixed, hermaphroditic, or otherwise) for mechanically and electrically connecting two or more wires or other conductors.

What is claimed is:

1. A switch assembly, comprising:
   a switch, having an open and a closed position; and
   a logic circuit electrically connected to the switch, wherein the logic circuit is configured to generate a test input signal to the switch and to receive an output signal from the switch when the switch is in the closed position, wherein the logic circuit is configured to report a switch fault when the output signal received from the switch differs from the test input signal sent to the switch, and wherein the logic circuit is operable to activate and deactivate the switch by selectively supplying power to the switch.

2. The switch assembly of claim 1, wherein the logic circuit is configured to generate a fault signal when the output signal received from the switch is not responsive to the test input signal sent to the switch.

3. The switch assembly of claim 1, wherein the output signal defines an output wave form, and wherein the test input signal defines an input wave form, and wherein the logic circuit is configured to deactivate the switch when the output wave form fails to change with the input wave form.

4. The switch assembly of claim 1, wherein the logic circuit is configured to compare the output signal received from the switch when the switch is closed.

5. The switch assembly of claim 1, wherein the logic circuit determines when the switch is closed when the output signal is received from the switch.

6. The switch assembly of claim 1, wherein input and output signals are time varying digital signals.

7. The switch assembly of claim 1, wherein input and output signals are time varying analog signals.

8. The switch assembly of claim 1, wherein the logic circuit is configured to generate a fault signal when a frequency of the output signal does not match a frequency of the test input signal.

9. The switch assembly of claim 1, wherein the logic circuit is configured to generate a fault signal when a duty cycle of the output signal does not match a duty cycle of the test input signal.

10. The switch assembly of claim 1, wherein the output signal is at a low voltage when the test input signal is at a high voltage.

11. The switch assembly of claim 1, wherein the logic circuit comprises:
    a power switch configured to selectively provide power to the switch.

12. The switch assembly of claim 11, wherein the logic circuit is configured to control the power switch to generate the test input signal.

13. The switch assembly of claim 1, wherein the logic circuit is operable to send the switch fault to a fault detection circuit.

14. The switch assembly of claim 1, wherein the logic circuit is operable to activate an external system when the test input signal matches the output signal.

15. The switch assembly of claim 1, comprising:
    a housing, wherein the logic circuit is at least partially enclosed by the housing.

16. The switch assembly of claim 15, wherein the switch is at least partially enclosed by the housing and projects through the housing.

17. The switch assembly of claim 15, wherein the housing includes a power input terminal electrically connected to an external power source, a control output terminal electrically connected to an external system, and a status terminal that is electrically connected to a fault detection system.

18. The switch assembly of claim 17, wherein the power input terminal, control output terminal, and status terminal are electrically connected to the logic circuit.

* * * * *